(12) United States Patent
Nakano

(10) Patent No.: US 9,773,936 B2
(45) Date of Patent: Sep. 26, 2017

(54) SEMICONDUCTOR DEVICE

(71) Applicant: FUJI ELECTRIC CO., LTD., Kawasaki-shi (JP)

(72) Inventor: Hayato Nakano, Kofu (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/942,831

(22) Filed: Nov. 16, 2015

(65) Prior Publication Data

US 2016/0071998 A1    Mar. 10, 2016

Related U.S. Application Data

(63) Continuation of application No. PCT/JP2014/061773, filed on Apr. 25, 2014.

(30) Foreign Application Priority Data

Jun. 4, 2013 (JP) .................. 2013-117915

(51) Int. Cl.
*H01L 31/12* (2006.01)
*H01L 31/173* (2006.01)
*H01L 31/153* (2006.01)
*H01L 29/78* (2006.01)
*H01L 29/16* (2006.01)
(Continued)

(52) U.S. Cl.
CPC ............ *H01L 31/12* (2013.01); *H01L 25/167* (2013.01); *H01L 29/1608* (2013.01); *H01L 29/7827* (2013.01); *H01L 31/14* (2013.01); *H01L 31/153* (2013.01); *H01L 31/173* (2013.01); *H01L 33/0033* (2013.01); *H01L 33/0041* (2013.01); *H01L 33/32* (2013.01); *H01L 33/34* (2013.01); *H01L 2224/32225* (2013.01); *H01L 2224/48091* (2013.01); *H01L 2224/48227* (2013.01);
(Continued)

(58) Field of Classification Search
CPC ....... H01L 31/12; H01L 31/14; H01L 31/153; H01L 31/173; H01L 33/0033; H01L 33/0041
See application file for complete search history.

(56) References Cited

U.S. PATENT DOCUMENTS 4,989,934 A * 2/1991 Zavracky ............. G02B 6/4202
385/14
5,488,468 A * 1/1996 Kawanishi .......... G01B 11/026
356/3.02
(Continued)

FOREIGN PATENT DOCUMENTS

JP     03-261877 A     11/1991
JP     07-135731 A      5/1995
(Continued)

*Primary Examiner* — Eduardo A Rodela
(74) *Attorney, Agent, or Firm* — Rabin & Berdo, P.C.

(57) ABSTRACT

A semiconductor device is provided, which has a wide-bandgap semiconductor element, such as a SiC element, and which includes a sensor capable of responding sufficiently to characteristic requirements for protecting and controlling the semiconductor element. The semiconductor device includes a wide-bandgap semiconductor element mounted on a substrate; and a light-receiving element that receives light emitted from the wide-bandgap semiconductor element when the wide-bandgap semiconductor element is in a conduction state.

4 Claims, 6 Drawing Sheets

(51) Int. Cl.
*H01L 31/14* (2006.01)
*H01L 33/00* (2010.01)
*H01L 33/32* (2010.01)
*H01L 33/34* (2010.01)
*H01L 25/16* (2006.01)

(52) U.S. Cl.
CPC ............... *H01L 2224/73265* (2013.01); *H01L 2924/12032* (2013.01)

(56) References Cited

U.S. PATENT DOCUMENTS

| | | | | |
|---|---|---|---|---|
| 5,780,875 | A * | 7/1998 | Tsuji | G02B 6/4224 257/81 |
| 6,278,138 | B1 * | 8/2001 | Suzuki | G02B 6/12 257/103 |
| 6,340,826 | B1 * | 1/2002 | Iliadis | H01L 33/34 257/292 |
| 9,012,826 | B2 * | 4/2015 | Wong | G01J 1/4257 250/201.1 |
| 2005/0285228 | A1 | 12/2005 | Sugawara | |
| 2007/0096081 | A1 | 5/2007 | Sugawara | |
| 2007/0216469 | A1 * | 9/2007 | Sakamoto | H03K 17/063 327/519 |
| 2010/0150202 | A1 | 6/2010 | Asano et al. | |
| 2013/0026494 | A1 | 1/2013 | Oritsuki et al. | |
| 2014/0001472 | A1 | 1/2014 | Furukawa et al. | |

FOREIGN PATENT DOCUMENTS

| | | |
|---|---|---|
| JP | 10-038964 A | 2/1998 |
| JP | 2002-325427 A | 11/2002 |
| JP | 2007-093335 A | 4/2007 |
| JP | 2008-294452 A | 12/2008 |
| JP | 2009-064852 A | 3/2009 |
| JP | 2010-025756 A | 2/2010 |
| JP | 2013-026563 A | 2/2013 |
| WO | WO-2005/013361 A1 | 2/2005 |
| WO | WO-2012/086099 A1 | 6/2012 |

\* cited by examiner

… … …

SEMICONDUCTOR DEVICE

CROSS-REFERENCE TO RELATED APPLICATION(S)

This non-provisional Application for a U.S. Patent is a Continuation of International Application PCT/JP2014/061773 filed Apr. 25, 2014, which claims priority from JP PA 2013-117915 filed Jun. 4, 2013, the entire contents of both of which are hereby incorporated by reference.

BACKGROUND OF THE INVENTION

1. Field of the Invention

The present invention relates to a semiconductor device.

2. Background of the Related Art

In general, an intelligent power module (IPM) is a semiconductor device in which a power semiconductor element, a control circuit, a driving circuit, a protection circuit, and the like form a module. According to a conventional sensor technique for the IPM, a sense diode in which diodes are formed on a power semiconductor element is known. According to another sensor technique, a shunt resistor and a thermistor are provided in a power semiconductor module, a shunt resistor is used as a current sensor, and a thermistor is used as a temperature sensor. When a power semiconductor element operates, heat corresponding to the loss thereof is generated. The sensor technique detects the temperature of the power semiconductor element and controls a gate voltage and the like to protect the power semiconductor element so that the power semiconductor element does not malfunction due to this heat.

A sense diode detects the temperature of a power semiconductor element based on the temperature dependence of the current characteristics of the sense diode. Since silicon which is a conventional semiconductor element material has large current-temperature dependence, a sense diode formed from silicon can easily detect the temperature based on a change in current. On the other hand, a wide-bandgap semiconductor element such as a silicon carbide (SiC) which attracts attention as a next-generation semiconductor material has smaller current-temperature dependence than silicon. Thus, when a sense diode is manufactured using the same material as the wide-bandgap semiconductor element, it is difficult to obtain sufficient accuracy. Moreover, when a sense diode is manufactured using a silicon semiconductor by a step separate from the step of manufacturing the wide-bandgap semiconductor element, the number of manufacturing steps may increase.

A shunt resistor and a thermistor are generally formed at a position different from a power semiconductor element on an insulating circuit substrate within the power semiconductor module. Thus, the use of a shunt resistor and a thermistor can become the cause of an increase in external size of the power semiconductor module. Moreover, since the shunt resistor and the thermistor are separated from the power semiconductor element, the response speed for temperature detection is not always fast. Due to this, it is sometimes difficult to obtain sufficient characteristics required for sensors used for a protection circuit and a control circuit.

Moreover, a method of calculating a junction temperature of a SiC gate turn-off thyristor (GTO) which is a semiconductor switching element by utilizing the fact that a storage time TS as a turn-off characteristic time of the SiC GTO has large temperature dependence is known as a method of measuring the temperature of a semiconductor device, see Japanese Patent Application Publication No. 2007-93335 (Patent Literature 1). However, this method relates to GTOs and it is difficult to apply the method to measurement of the temperature of other semiconductor elements such as a metal-oxide semiconductor field-effect transistor (MOSFET).

Moreover, a silicon carbide semiconductor device having a diode (Schottky barrier diode (SBD)) for measuring the temperature of a silicon carbide semiconductor element is known. In this device, an anode voltage corresponding to a setting temperature at which a control IC has to stop a MOSFET is calculated by examining current-voltage characteristics of the SBD. Moreover, the MOSFET is protected from being overheated by setting the anode voltage to the calculated voltage, see WO 2012/086099 (Patent Literature 2). However, this device could not be applied to a semiconductor device which does not have a SBD.

Further, a SiC semiconductor device in which a temperature-detecting resistor is formed using a portion of a barrier metal formed on a bottom surface of a semiconductor element and the temperature of a SiC semiconductor is detected using the fact that a resistance value of the temperature-detecting resistor changes depending on temperature is known, see Japanese Patent Application Publication No. 2013-26563 (Patent Literature 3). However, when temperature is measured using the temperature-detecting resistor, it is necessary for the temperature-detecting resistor to have a large length in order to obtain an output voltage of a certain magnitude. Thus, a region in which the temperature-detecting resistor is to be provided is limited.

Further, an apparatus for measuring the temperature of a semiconductor substrate is known. In this apparatus, light from a light source strikes the semiconductor substrate and light scattered from the semiconductor substrate is received and dispersed to obtain the optical spectrum thereof. The temperature of the semiconductor substrate is calculated and measured based on the optical spectrum, see Japanese Patent Application Publication No. 2010-25756 (Patent Literature 4). However, this apparatus is a temperature measuring apparatus for a semiconductor substrate which is a material of a semiconductor device and is not an apparatus for measuring the temperature of a semiconductor device in operation.

An object of the present invention is to provide a semiconductor device which has a wide-bandgap semiconductor element such as a SiC and which includes a sensor having sufficient characteristics required for protecting and controlling the semiconductor element.

SUMMARY OF THE INVENTION

A semiconductor device according to the present invention includes: a wide-bandgap semiconductor element; and a light-receiving element that receives light emitted from the wide-bandgap semiconductor element such as when the wide-bandgap semiconductor element is in a conduction state.

The semiconductor device of the present invention includes a light-receiving element that receives light emitted from a wide-bandgap semiconductor element when the wide-bandgap semiconductor element is in a conduction state, and the light-receiving element detects the intensity of the light emitted from the wide-bandgap semiconductor element. Moreover, it is possible to obtain the current value flowing through the wide-bandgap semiconductor element based on the light intensity. Due to this, it is possible to detect the current flowing through the wide-bandgap semiconductor element, the temperature of the wide-bandgap semiconductor element, and the like, at a satisfactory response speed. Moreover, it is advantageous in decreasing the size of the semiconductor device.

DETAILED DESCRIPTION OF THE INVENTION

Hereinafter, an embodiment of a semiconductor device according to the present invention will be described in detail with reference to the drawings.

Figure 1:
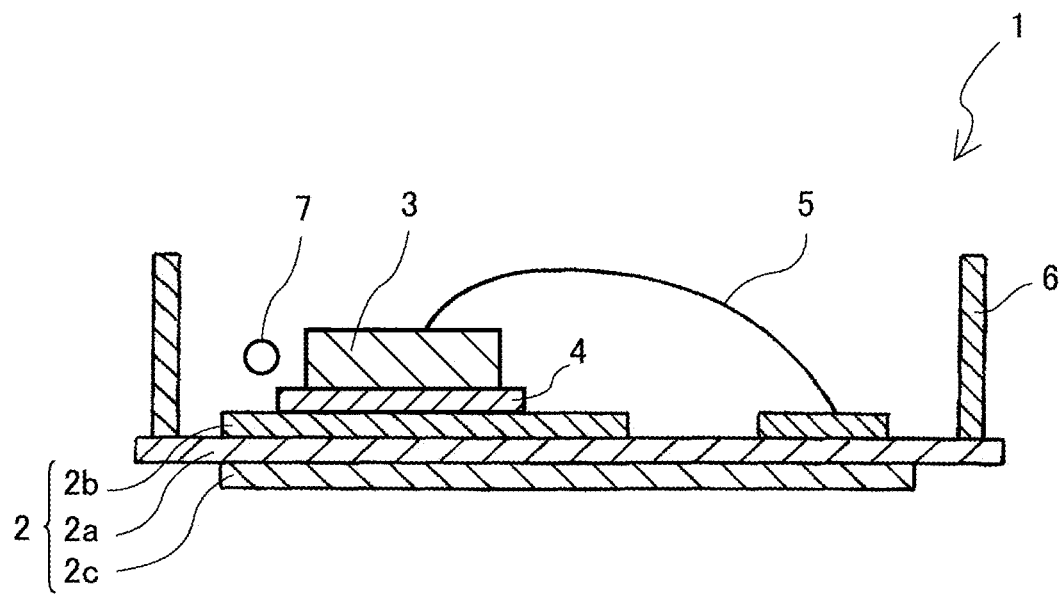
FIG. 1 is a schematic cross-sectional view of a semiconductor device according to an embodiment of the present invention.

FIG. 1 is a schematic cross-sectional view of a power semiconductor module as a semiconductor device 1 according to an embodiment of the present invention. The semiconductor device 1 illustrated in FIG. 1 has a power semiconductor chip 3 which is bonded to an insulating circuit substrate 2 by a solder 4. The insulating circuit substrate 2 has an insulating substrate 2a in which a conductive layer 2b is selectively formed on one surface thereof, whereby a circuit pattern that electrically connects the insulating circuit substrate 2 to the semiconductor device 1 is formed. A conductive layer 2c is formed on the other surface of the insulating substrate 2a.

The power semiconductor chip 3 is formed of a wide-bandgap semiconductor (specifically, a silicon carbide (SiC) or a gallium nitride (GaN), for example). The power semiconductor chip 3 has an electrode which is formed on a surface facing the insulating circuit substrate 2 and which is electrically connected to the conductive layer 2b by the solder 4. Moreover, the power semiconductor chip 3 has an electrode which is formed on a surface opposite the surface facing the insulating circuit substrate 2 and which is electrically connected to the conductive layer 2b and other elements and the like by a bonding wire 5. The bonding wire 5 is not an essential element, but the electrode may be electrically connected by a pin, a flat plate, or the like formed of a conductive material.

The semiconductor device 1 may have a control substrate or the like having a circuit for protecting and controlling the power semiconductor chip 3; however, such a control substrate is not illustrated in FIG. 1. Moreover, the semiconductor device 1 may have the power semiconductor chip 3 accommodated in a case 6, and the case 6 may be filled with gel in order to increase the withstand voltage.

A light-receiving element 7 is provided in the case 6 near the power semiconductor chip 3. This light-receiving element 7 is configured to receive light emitted from the power semiconductor chip 3.

The power semiconductor chip 3 which uses a wide-bandgap semiconductor such as SiC or GaN having a larger bandgap than Si emits light corresponding to the bandgap during conduction because the bandgap is large. The intensity of the light has a linear relation with the magnitude of current flowing through the power semiconductor chip 3. Thus, the semiconductor device 1 of the present embodiment detects the intensity of light emitted from the power semiconductor chip 3 with the aid of the light-receiving element 7 provided near the power semiconductor chip 3. Moreover, the current value flowing through the power semiconductor chip is calculated based on the detected light intensity. The light-receiving element 7 is not particularly limited as long as it can detect light of a specific spectrum corresponding to the bandgap of a material of the power semiconductor chip 3.

Figure 2:
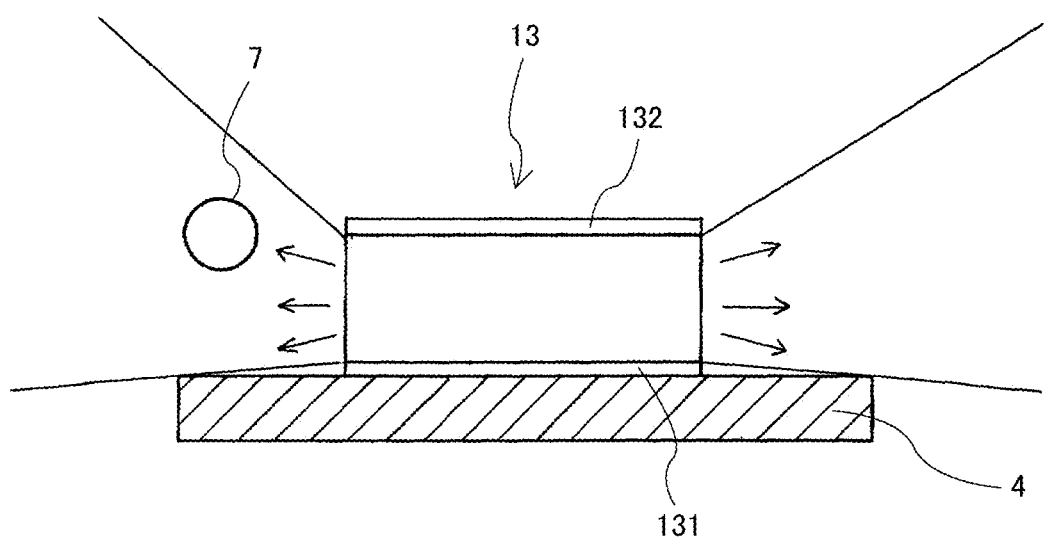
FIG. 2 is a front view of a Schottky barrier diode as a power semiconductor chip.

With reference to FIG. 2, an example in which the power semiconductor chip 3 is a Schottky barrier diode 13 formed of SiC will be described. The Schottky barrier diode 13 illustrated in FIG. 2 as the power semiconductor chip 3 includes a first electrode 131 formed on a surface facing a direct copper bonding (DCB) substrate, for example, as the insulating circuit substrate 2 and a second electrode 132 on a surface opposite the first electrode 131. In this example, when current flows through the Schottky barrier diode 13, light radiates from lateral surfaces of the Schottky barrier diode 13 as indicated by arrows in the drawing but does not radiate from the surfaces on which the electrodes 131 and 132 are formed. Thus, the light-receiving element 7 is disposed near the lateral surface of the Schottky barrier diode 13.

The light-receiving element 7 may be provided on the conductive layer 2b so as to be electrically connected to the conductive layer 2b of the insulating circuit substrate 2. Moreover, the light-receiving element 7 may be provided so as to be electrically connected to a control substrate or the like (not illustrated) provided above the insulating circuit substrate 2 and be positioned in the mid-air in a state of being suspended from the control substrate or the like. Even when the Schottky barrier diode 13 is sealed by gel in the case 6, if the gel can transmit light, the light-receiving element 7 can receive light from the Schottky barrier diode 13. Moreover, an inlet portion of an optical waveguide such as an optical fiber may be disposed near the lateral surface of the Schottky barrier diode 13 and the light from the Schottky barrier diode 13 may be guided to the light-receiving element 7 provided in another place through the optical waveguide.

How the current value and the temperature of the Schottky barrier diode 13 are detected and controlled using the light-receiving element 7 during conduction of the Schottky barrier diode 13 will be described.

The magnitude of current flowing through the Schottky barrier diode 13 and the intensity of light radiated from the Schottky barrier diode 13 are in a linear relation as described above. Thus, the relation between the intensity of light radiated from the Schottky barrier diode 13 and the magnitude of current flowing through the Schottky barrier diode 13 is stored in advance as a database. By referring to this database, a control (protection) circuit including the light-receiving element 7 can obtain a current value flowing through the Schottky barrier diode 13 during conduction based on the intensity of light received from the light-receiving element 7.

Moreover, the amount of heat generated from the Schottky barrier diode 13 can be calculated based on the obtained current value, a voltage applied between the electrodes of the Schottky barrier diode 13, and an accumulated conduction period. Moreover, the temperature of the Schottky barrier diode 13 can be detected based on the amount of generated heat and the temperature characteristics of the Schottky barrier diode 13 determined in association with the heat dissipation ability of the insulating circuit substrate 2, the heat conduction characteristics of the gel, and the like.

In this manner, in the present invention, the light during conduction of the Schottky barrier diode 13 is received, the intensity of the light is calculated, and the current value flowing through the Schottky barrier diode 13 is obtained based on the light intensity. Moreover, the temperature of the Schottky barrier diode 13 can be detected from the current value. In the present invention, since a sensor such as a sense diode is not formed on a semiconductor element, the current density of the semiconductor element is not sacrificed. Moreover, since the response speed for detecting the temperature is fast, it is more advantageous than using a thermistor or the like. Moreover, since the light-receiving element can be disposed in the mid-air, it is advantageous in decreasing the size of a power semiconductor module.

Further, when the temperature of the Schottky barrier diode 13 reaches an upper limit of its operating temperature, control of stopping the operation of the Schottky barrier diode 13 or lowering the voltage applied to the Schottky barrier diode 13 is performed. In this way, it is possible to protect the Schottky barrier diode 13.

Figure 3:
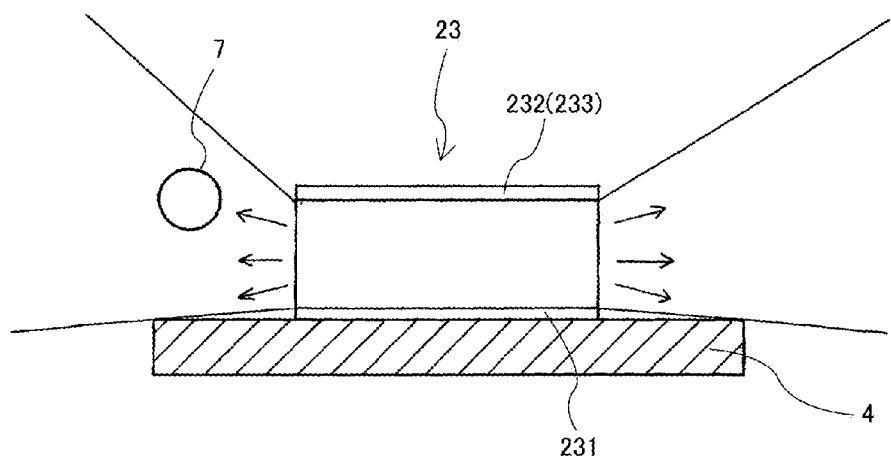
FIG. 3 is a front view of a MOSFET as a power semiconductor chip.
Figure 4:
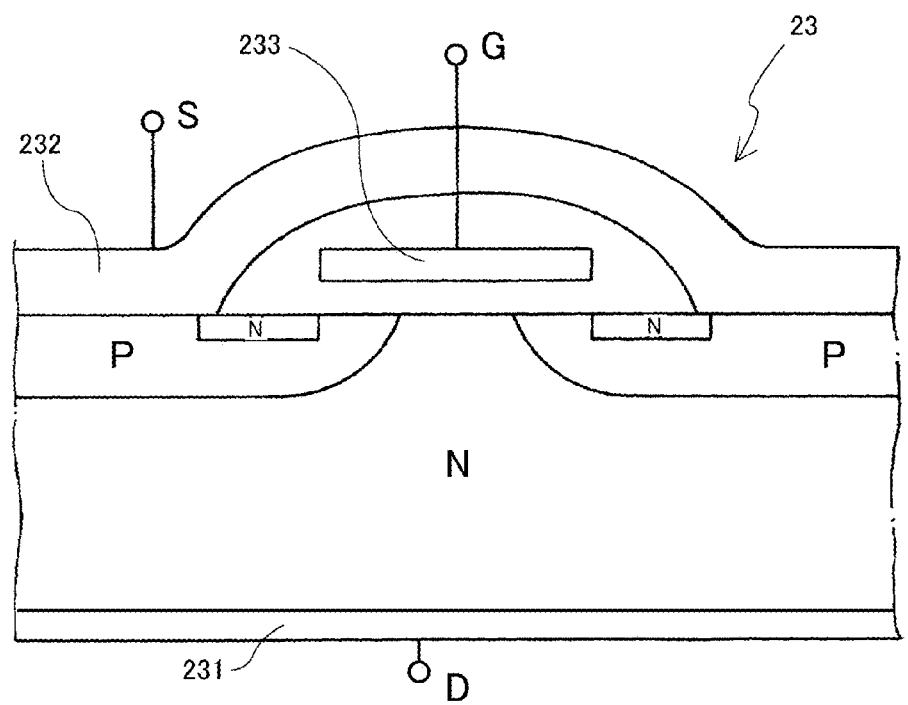
FIG. 4 is a schematic cross-sectional view of a MOSFET.
Figure 5:
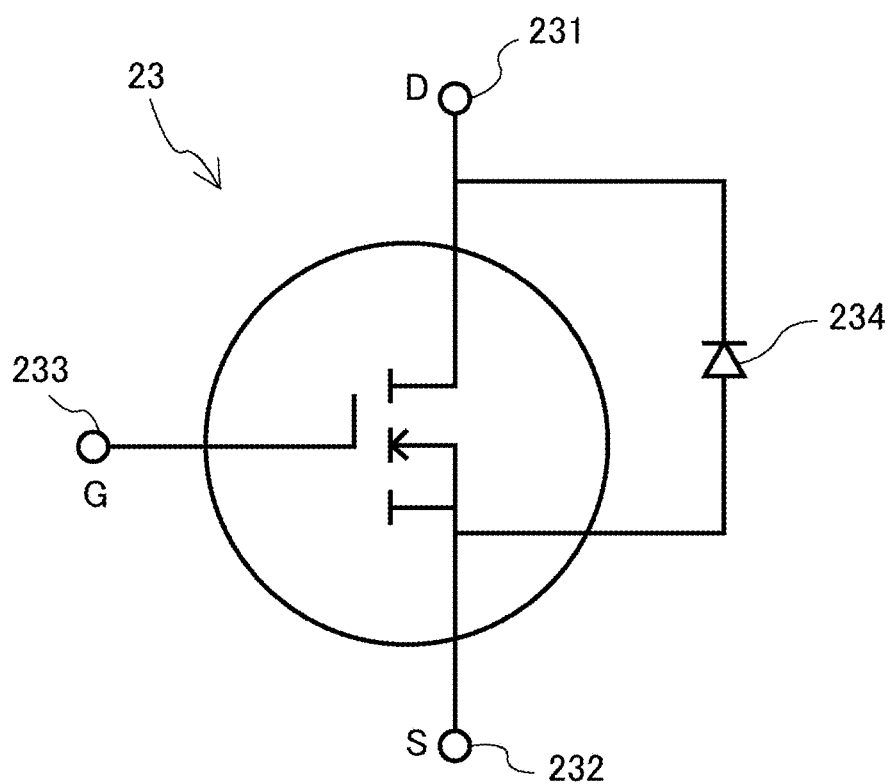
FIG. 5 is a circuit diagram of a MOSFET.

With reference to FIG. 3, a case in which the power semiconductor chip 3 is a MOSFET 23 formed of SiC will be described. The MOSFET 23 illustrated in FIG. 3 as the power semiconductor chip 3 includes a drain electrode 231 formed on a surface facing the insulating circuit substrate 2 and a source electrode 232 and a gate electrode 233 formed on a surface opposite the drain electrode 231. That is, the MOSFET 23 illustrated in FIG. 3 is a vertical semiconductor element. FIG. 4 illustrates a schematic cross-sectional view of the MOSFET 23 and FIG. 5 illustrates a circuit diagram of the MOSFET 23. The MOSFET 23 has a body diode 234 (parasitic diode) which is inevitably formed between the source electrode 232 and the drain electrode 231.

When current flows through the body diode 234 of the MOSFET 23 formed of SiC, light corresponding to the bandgap of SiC is emitted. This light is received by the light-receiving element 7.

When current flows through the MOSFET 23 illustrated in FIG. 3, light is radiated from the lateral surfaces of the MOSFET 23 as indicated by arrows in the drawing. Thus, the light-receiving element 7 is disposed near the lateral surface of the MOSFET 23.

The light-receiving element 7 may be provided on the conductive layer 2b so as to be electrically connected to the conductive layer 2b of the insulating circuit substrate 2. Moreover, the light-receiving element 7 may be provided so as to be electrically connected to a control substrate or the like (not illustrated) provided above the insulating circuit substrate 2 and be positioned in the mid-air in a state of being suspended from the control substrate or the like. Even when the MOSFET 23 is sealed by gel in the case 6, if the gel can transmit light, the light-receiving element 7 can receive light from the MOSFET 23. Moreover, an inlet portion of an optical waveguide such as an optical fiber may be disposed near the lateral surface of the MOSFET 23 and the light from the MOSFET 23 may be guided to the light-receiving element 7 provided in another place through the optical waveguide.

How the current value and the temperature of the MOSFET 23 are detected and controlled using the light-receiving element 7 during conduction of the MOSFET 23 will be described.

The magnitude of current flowing through the body diode 234 the MOSFET 23 and the intensity of light radiated from the MOSFET 23 are in a linear relation.

Figure 6A:
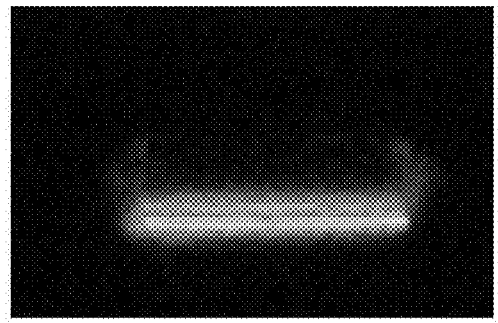
FIGS. 6A, 6B, 6C, 6D, 6E, and 6F are pictures of halftone images obtained by imaging light radiated from a MOSFET and displayed on a display.
Figure 6B:
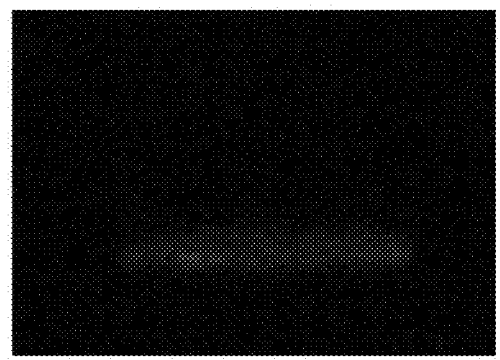
Figure 6C:
Figure 6D:
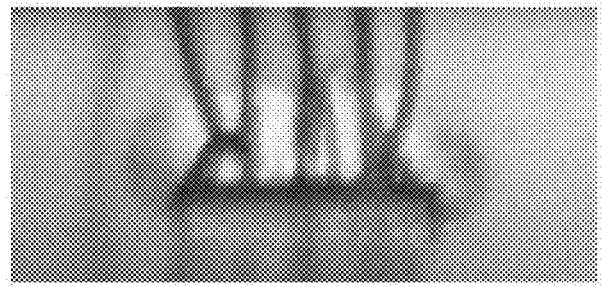
Figure 6E:
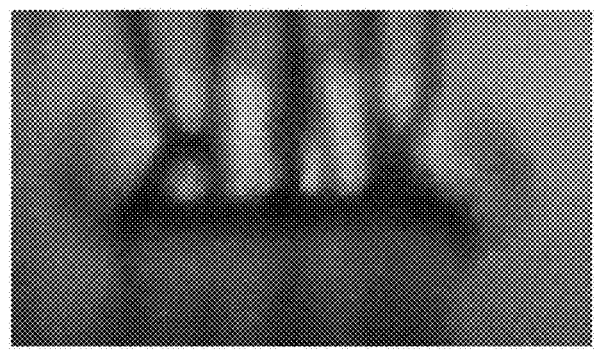
Figure 6F:
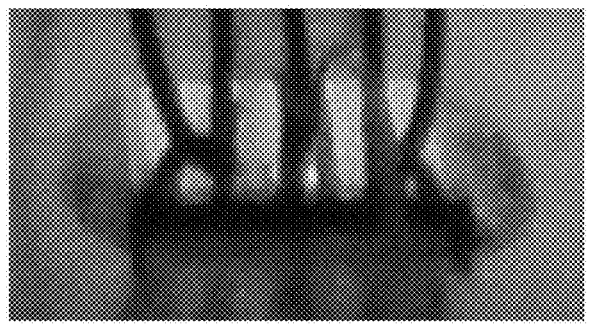

FIGS. 6A, 6B, 6C, 6D, 6E, and 6F illustrate pictures of halftone images obtained by imaging light radiated from the MOSFET 23 and displayed on a display. FIGS. 6A to 6C illustrate the pictures when the surroundings are shielded from light. FIGS. 6A to 6C illustrate the cases when the current value flowing through the body diode 234 is 1 A, 0.17 A, and 0 A, respectively. FIGS. 6D to 6F illustrate the pictures when the surroundings are not shielded from light. FIGS. 6D to 6F illustrate the case when the current value flowing through the body diode 234 is 8 A, 4 A, and 1 A, respectively. The cases illustrated in FIGS. 6A and 6F are different depending on whether the surroundings are shielded or not, but the current value flowing through the body diode 234 is the same. It can be understood from FIGS. 6A to 6F that light is not emitted when the current value is 0 A (FIG. 6C, and the larger the current value, the stronger the light emitted.

Thus, the relation between the intensity of light radiated from the MOSFET 23 and the magnitude of current flowing through the body diode 234 of the MOSFET 23 is stored in advance as a database. By referring to this database, a control (protection) circuit including the light-receiving element 7 can obtain a current value flowing through the body diode 234 of the MOSFET 23 during conduction based on the intensity of light received from the light-receiving element 7.

Moreover, the amount of heat generated from the MOSFET 23 can be calculated based on the obtained current value, a voltage applied between the electrodes of the body diode 234 of the MOSFET 23, and an accumulated conduction period. Moreover, the temperature of the MOSFET 23 can be detected based on the amount of generated heat and the temperature characteristics of the MOSFET 23 determined in association with the heat dissipation ability of the insulating circuit substrate, the heat conduction characteristics of the gel, and the like.

It may be undesirable that current flows through the body diode 234 of the MOSFET 23. Thus, when the light-receiving element 7 detects light, an alarm signal may be output upon detecting the light, whereby immediately control may be implemented to set the gate voltage of the MOSFET 23 to zero in order to stop the operation of the MOSFET 23.

Moreover, when the temperature of the MOSFET 23 reaches an upper limit (for example, 150° C.) of its operating temperature, control of setting the gate voltage to zero to stop the operation of the MOSFET 23 or decreasing the gate voltage may be performed to protect the MOSFET 23.

The control of decreasing the gate voltage may be performed in the following manner, for example. The relation between the light intensity L1, L2, L3, . . . , and Ln of the light-receiving element 7 and the current I1, I2, I3, . . . , and In flowing through the body diode 234 is acquired in advance as a database. Moreover, the relation between the current I1, I2, I3, . . . , and In flowing through the body diode 234 and the temperature characteristics of the MOSFET 23 is also acquired in advance as a database. During operation of the MOSFET 23, when the temperature of the MOSFET 23 obtained based on the light intensity of the light-receiving element, the current flowing through the body diode 234 at that time, and the accumulated period reaches 150° C., for example, the gate voltage is decreased. Moreover, the temperature of the MOSFET 23 is calculated again from the relation between the current value flowing through the body diode 234 at the decreased gate voltage and the temperature characteristics of the MOSFET 23. The gate voltage is controlled so that the temperature does not exceed 150° C.

In this manner, the light during conduction of the MOSFET 23 is received and the intensity of the light is calculated, the current value flowing through the body diode 234 of the MOSFET 23 is calculated based on the light intensity, and the temperature of the MOSFET 23 can be detected from the current value. Since a sensor such as a sense diode is not formed on a semiconductor element, the current density of the semiconductor element is not sacrificed. Moreover, since the response speed for detecting the temperature is fast, it is more advantageous than using a thermistor. Moreover, since the light-receiving element can be disposed in the mid-air, it is advantageous in decreasing the size of a power semiconductor module.

A power semiconductor module obtained by combining the Schottky barrier diode 13 formed of SiC and the MOSFET 23 formed of SiC is known. In such a power semiconductor module, the light-receiving element 7 may be disposed near the lateral surface of at least one power semiconductor chip (preferably both power semiconductor chips) selected from the Schottky barrier diode 13 and the MOSFET 23. By doing so, it is possible to detect the current value and the temperature of such a power semiconductor chip.

An embodiment of the semiconductor device of the present invention has been described with reference to the drawings. However, the semiconductor device of the present invention is not limited to that described in the embodiment and illustrated in the drawings but various modifications can be made without departing from the spirit of the present invention. For example, although the case of a SiC semiconductor has been described in the embodiment, the present invention can be applied similarly to a case where the power semiconductor chip 3 is a GaN semiconductor.

EXPLANATION OF REFERENCE NUMERALS

1: Semiconductor device
2: Insulating circuit substrate
3: Power semiconductor chip
4: Solder
5: Bonding wire
6: Case
7: Light-receiving element
13: Schottky barrier diode
23: MOSFET

What is claimed is:

1. A semiconductor device that is a power semiconductor module having a power semiconductor element and a protection circuit with a sensor for protecting and controlling the power semiconductor element, the semiconductor device comprising:
    as said power semiconductor element, a wide-bandgap semiconductor element comprised of a wide-bandgap semiconductor that emits light in a conduction state; and
    as said sensor, a light-receiving element that is disposed near a lateral surface of the wide-bandgap semiconductor element so as to receive light emitted from the wide-bandgap semiconductor element.

2. The semiconductor device according to claim 1, wherein the light receiving element detects the intensity of the light emitted from the wide-bandgap semiconductor element to obtain a current value flowing through the wide-bandgap semiconductor element based on the intensity of the light.

3. The semiconductor device according to claim 2, wherein the wide-bandgap semiconductor element includes a MOSFET or a Schottky barrier diode.

4. The semiconductor device according to claim 1, wherein the wide-bandgap semiconductor element is formed of silicon carbide or gallium nitride.

* * * * *